United States Patent [19]
Dobson et al.

[11] Patent Number: 5,492,737
[45] Date of Patent: Feb. 20, 1996

[54] DEPOSITION APPARATUS AND METHOD

[75] Inventors: Christopher Dobson; Adrian Kiermasz, Clevedon; Knut Beekmann, Weston-Super-Mare; Christine Shearer, Bedminster; Edmond Ling, Stoke Gifford; Alan Winn, Bristol; Rob Wilby, Nailsea, all of United Kingdom

[73] Assignee: Electrotech Equipments Limited, Bristol, United Kingdom

[21] Appl. No.: 244,573

[22] PCT Filed: Dec. 2, 1992

[86] PCT No.: PCT/GB92/02238

§ 371 Date: Aug. 1, 1994

§ 102(e) Date: Aug. 1, 1994

[87] PCT Pub. No.: WO93/11276

PCT Pub. Date: Jun. 10, 1993

[30] Foreign Application Priority Data

Dec. 4, 1991 [GB] United Kingdom ............... 9125771

[51] Int. Cl.⁶ ............................................ C23C 14/26
[52] U.S. Cl. .................. 427/587; 118/500; 118/663; 118/723 R; 427/248.1; 427/569
[58] Field of Search ................ 118/723 R, 500, 118/663; 427/587, 248.1, 569

[56] References Cited

U.S. PATENT DOCUMENTS 4,543,576  9/1985  Hieber et al. .................. 340/870.17

FOREIGN PATENT DOCUMENTS

| | | |
|---|---|---|
| 0393985 | 10/1990 | European Pat. Off. . |
| 58-159843 | 9/1983 | Japan . |
| 60-197875 | 10/1985 | Japan . |
| 62-243765 | 10/1987 | Japan . |
| 63-317676 | 12/1988 | Japan . |

*Primary Examiner*—Bernard Pianalto
*Attorney, Agent, or Firm*—Young & Thompson

[57] ABSTRACT

A reactor 10 defines a chamber 11 in which are disposed an upper electrode 12 and a lower workpiece electrode 13. The upper electrode is connected to a R.F. supply whilst the lower electrode is connected to a stress control unit 14. The stress control unit is used to adjust or maintain the effective resistance of the connection between the workpiece electrode 13 and ground.

7 Claims, 3 Drawing Sheets

DEPOSITION APPARATUS AND METHOD

This invention relates to apparatus and methods relating to the deposition of films on workpieces and in particular to the stress set up in those films during the deposition process.

The need to deposit thin layers of material particularly arises in the manufacture of semi-conductor devices, but this invention is not limited to the manufacture of such devices. However, in that field it is generally recognised that it is desirable to attempt to control the stress set up in the film during deposition, because if not controlled the stresses can be sufficient to lift the film from the surface of the workpiece. It has been known for a long time that such stresses can be controlled, to a degree, by altering process parameters such as pressure temperature gas flow rates etc. However variations in these parameters generally cause variations in other physical characteristics of the film and so the user of this approach generally settles on a compromise.

In plasma chemical vapour deposition processes it is known that the stress can be controlled by altering the frequency of the AC field which maintains the plasma discharge. However the frequency range in which stress is a minimum is also the band used for aircraft communication and so this technique is prohibited. Other proposals have been made for either switching between high and low frequency or providing a mix of frequencies but these too have their problems.

According to the present invention there is provided reactor apparatus comprising a chamber, means for forming a plasma within the chamber, an electrode for supporting the workpiece, means for allowing gas to be introduced into the chamber such that a film can be deposited on the workpiece, means for connecting the electrode to ground and including adjustable means for varying the effective resistance of the connection between the electrode and ground.

For the purposes of this specification the term "effective resistance" refers to the ease or otherwise with which a voltage on the electrode can drain to ground. It thus includes not only traditional resistance but also other means for affecting the current flow through the connection to ground.

Thus the adjustable means may include a variable resistance, or, alternatively, it may include means for adjusting the current flow through the connecting means and/or the voltage dropped across the connecting means. In this latter case the adjustable means may include a transistor connected to control the rate of voltage drain from the electrode to ground and means for adjustably controlling the transistor. The means for adjustably controlling the transistor may comprise means, such as an operational amplifier, for comparing the voltage on the electrode, or an indication thereof, with a preset voltage, or an indication thereof, and means for controlling the transistor to equate the electrode and preset voltages or indications thereof.

From another aspect the invention consists in apparatus for controlling the stress in a film deposited on an electrode comprising a reactor chamber, means for striking a plasma in the chamber, an electrode for supporting the workpiece in the chamber and means for varying the magnitude of the negative sheath associated with the electrode in the presence of the plasma to alter the film stress.

From a still further aspect the invention consists in a method of controlling the stress in a film deposited on a workpiece comprising, placing the workpiece on an electrode in a reactor chamber, introducing a gas into the chamber, connecting the workpiece electrode to ground via a variable effective resistance means and selecting the resistance of the variable effective resistance means in accordance with the desired stress characteristics.

Although the invention has been defined above it is to be understood that it includes any inventive combination of the features set out above or in the following description.

BRIEF DESCRIPTION OF THE DRAWINGS

The invention may be performed in various ways and a specific embodiment will now be described, by way of example, with reference to the accompanying drawings, in which.

DETAILED DESCRIPTION OF THE DRAWINGS

Figure 1:
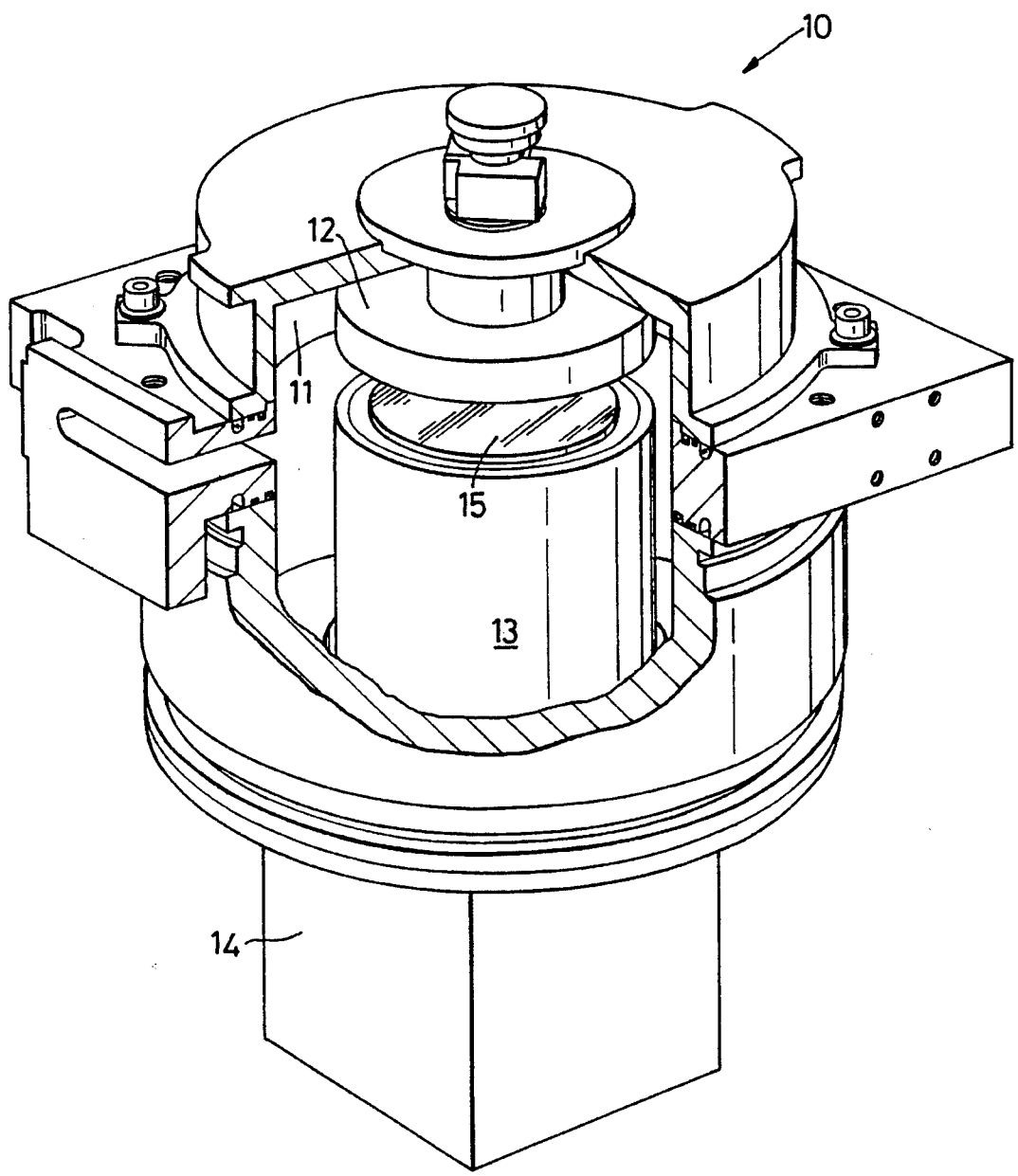
FIG. 1 is a schematic cut away view of the apparatus according to the invention.
Figure 2:
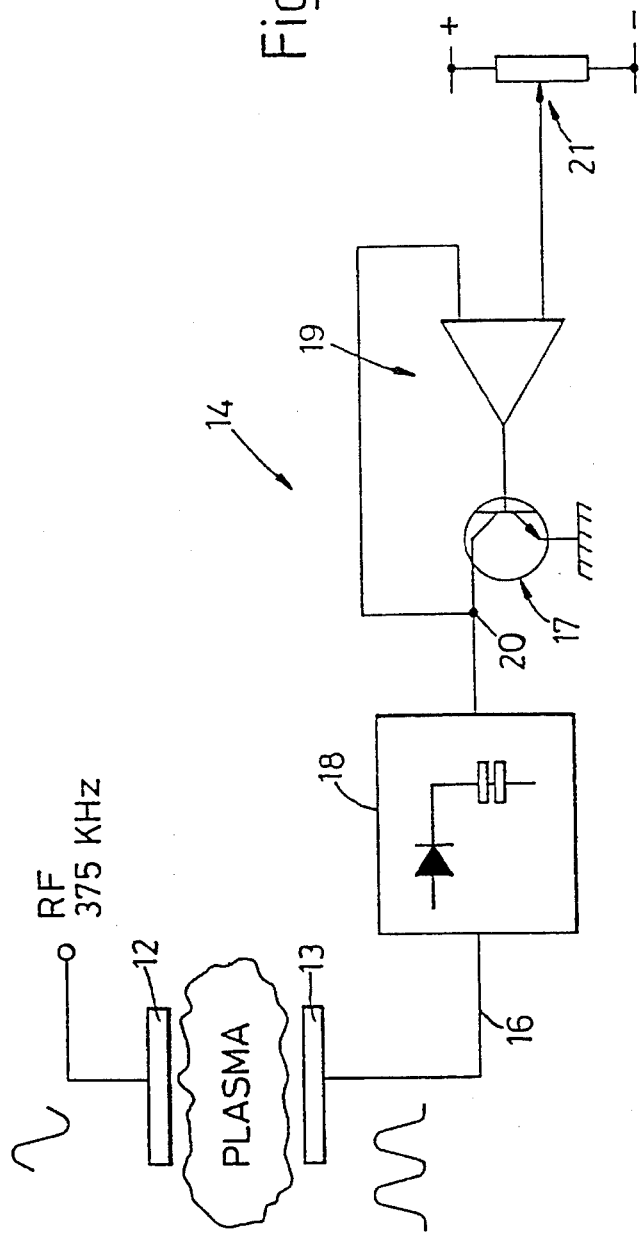
FIG. 2 is a schematic circuit diagram illustrating the power supply and stress control of the apparatus of FIG. 1.

FIG. 1 shows a reactor 10 defining a chamber 11 in which are disposed an upper electrode 12 and a lower workpiece electrode 13. As can be seen in FIG. 2 the upper electrode is connected to a R.F. supply whilst the lower electrode 13 is connected to a stress control unit generally indicated at 14. The workpiece 15 is seated on the lower electrode 13. The reactor 10 can be used for chemical deposition of a film onto the workpiece 15 in a manner which is generally well known. In brief, the method consists of striking a plasma within the chamber 11, which has previously been evacuated, and then introducing a working gas into the chamber; the gas being selected in accordance with the film which is required to be deposited. The plasma is set up by the R.F. present on the upper electrode.

Figure 4:
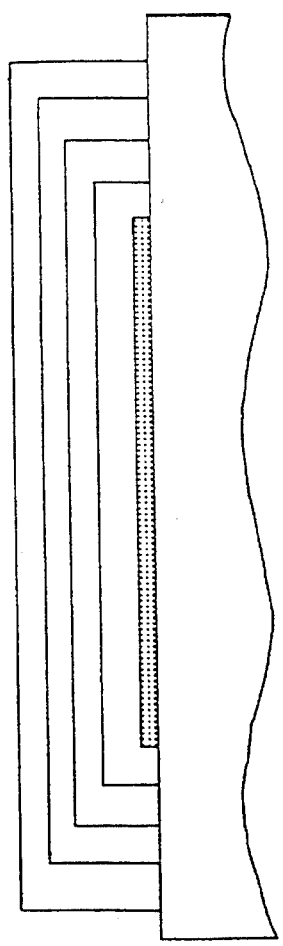
FIG. 4 is a diagrammatic representation showing the nature of a negative sheath formed above the workpiece electrode of the invention.

The existence of the plasma within the chamber causes a charge to be built up on the lower electrode 12 due to capacitance. The Applicants have determined that, quite surprisingly, the stress formed in films deposited on the workpiece is a function of the level of charge existing on the lower electrode 12. A possible explanation for this is that due to the high mobility of electrons, everything in the chamber which is at a floating potential and in contact with the plasma takes on a negative charge. As this charge is accumulated, a "sheath" builds up which slows down the rate at which electrons can escape. The result is a quasi-neutrality in the plasma. If any part of the system is grounded the sheath is reduced to zero. It would appear that the stress in the workpiece is a function of the magnitude of the sheath. The formation of the sheath is diagrammatically illustrated in FIG. 4.

Figure 3:
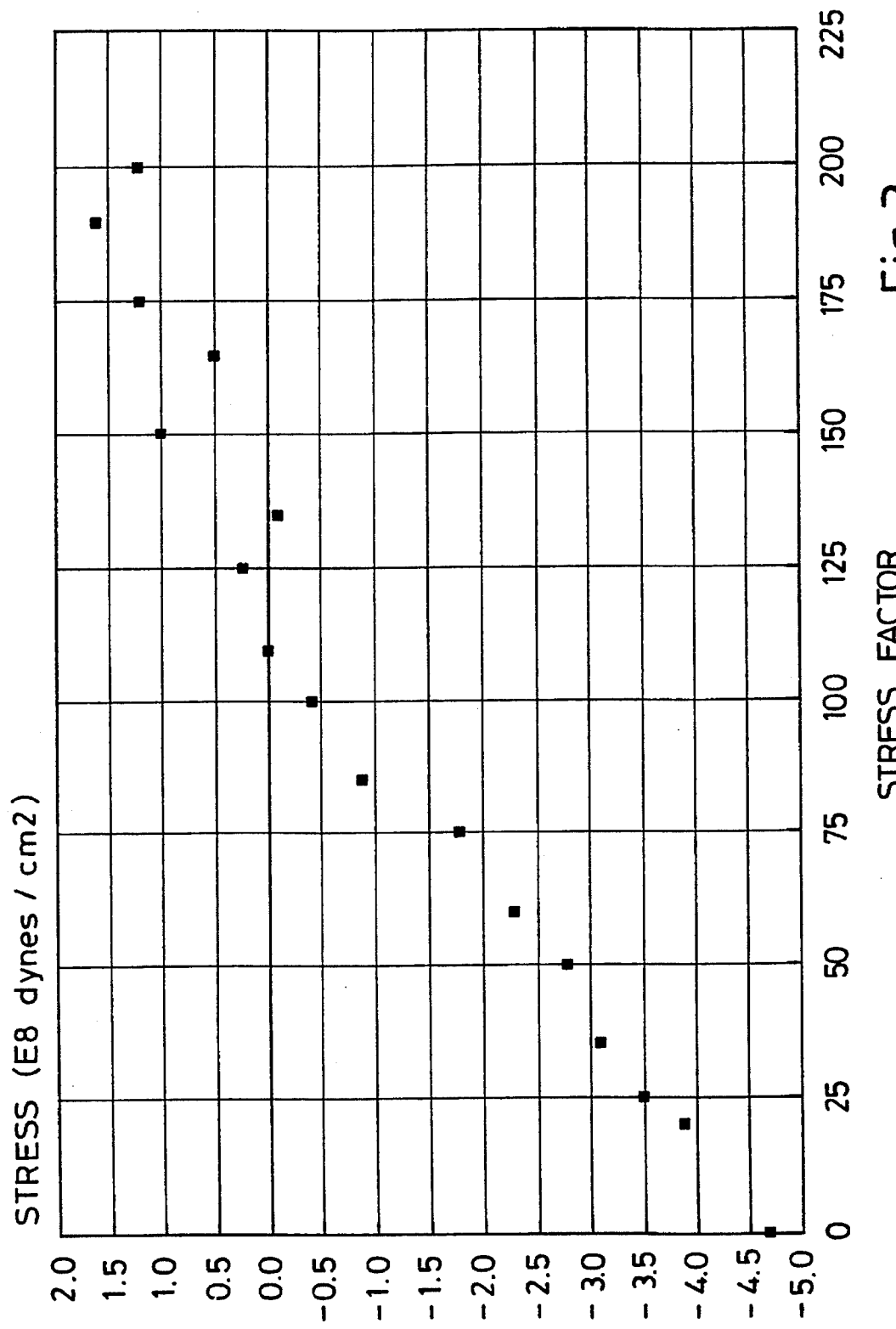
FIG. 3 is a graphical display of stress against "resistance" for a particular experimental set up using the apparatus of FIG. 1.

FIG. 3 shows a plot of stress against stress factor. For reasons, which will become apparent, the stress factor is actually represented in volts, but in essence an increasing stress factor value indicates an increasing effective resistance in a connection between the lower electrode 12 and ground. As can be seen a low effective resistance produces a high compressive stress whilst high effective resistance produces tensile stress. It will be readily understood that the ideal working condition is the one at which compressive stress changes to tensile stress i.e. there is no effective stress in the film. As can be seen from the graph this can be achieved by suitable selection of the stress factor. The value selected will differ from apparatus to apparatus and in accordance with the processing conditions, i.e. the nature of the working gas. However once determined for a particular set up, the stress factor can simply be selected or varied if difference stress characteristics are required.

Returning to FIG. 2, the stress control unit 14 comprises a connection 16 extending between the lower electrode 13 and ground. A transistor 17 is disposed in the connection 16 so as to control the rate of voltage drain from the electrode 13 to ground. As the voltage on the workpiece 15 is varying, it is convenient to also provide a rectifier 18 in the connection 16 between the electrode 12 and ground. The transistor 17 is controlled by a comparator 19, in the form of an operational amplifier, which compares the voltage at point 20 in the connection 16 with a set voltage set at 21 and drives the base of the transistor 17 so that the two voltages equate. The preset voltage can be varied to achieve selected stress values. It will be understood that the voltage at point 20 is directly proportional to the voltage on the workpiece 15 and so the result is a control of the workpiece voltage and hence the stress.

It will also be understood that other circuits for controlling voltage protection could be used e.g. a variable resistance. However the proposed circuit is particularly stable and easy to operate.

We claim:

1. A reactor apparatus comprising a chamber, means for forming a plasma within the chamber, an electrode for supporting the workpiece, means for allowing gas to be introduced into the chamber such that a film can be deposited on the workpiece, means for connecting the electrode to ground and including adjustable means for varying the effective resistance of the connections between the electrode and ground.

2. Apparatus as claimed in claim 1, wherein the adjustable means includes a variable resistance.

3. Apparatus as claimed in claim 1, wherein the adjustable means includes means for adjusting the current flowing through the connecting means and/or the voltage dropped across the connecting means.

4. Apparatus as claimed in claim 3, wherein the adjustable means include a transistor connected to control the rate of voltage drain from the electrode to ground and means for adjustably controlling the transistor.

5. Apparatus as claimed in claim 4, wherein in the means for adjustably controlling the transistor comprises means for comparing the voltage on the electrode, or an indication thereof, with a preset voltage and means for controlling the transistor to equate the electrode and preset voltages or the indications thereof.

6. A method of controlling the stress in a film deposited on a workpiece comprising placing the workpiece on an electrode in a reactor chamber, introducing a gas into the chamber, connecting the workpiece electrode to ground via a variable effective resistance means and selecting the resistance of the variable effective resistance means in accordance with the desired stress characteristics.

7. Apparatus for controlling the stress in a film deposited on an electrode comprising a reactor chamber, means for striking a plasma in the chamber, an electrode for supporting the workpiece in the chamber and means for varying the magnitude of the negative sheath associated with the electrode in the presence of the plasma to alter the film stress.

* * * * *